United States Patent
Osamura

(10) Patent No.: US 7,535,267 B2
(45) Date of Patent: May 19, 2009

(54) OUTPUT CIRCUIT AND OPERATIONAL AMPLIFIER

(75) Inventor: Nobuyoshi Osamura, Nishio (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/016,946

(22) Filed: Dec. 21, 2004

(65) Prior Publication Data

US 2005/0151569 A1  Jul. 14, 2005

(30) Foreign Application Priority Data

Jan. 13, 2004  (JP) .............................. 2004-005393

(51) Int. Cl.
H03K 3/00  (2006.01)
(52) U.S. Cl. ...................... 327/108; 327/109
(58) Field of Classification Search ................ 327/108, 327/109, 110, 111, 112
See application file for complete search history.

(56) References Cited

U.S. PATENT DOCUMENTS

| | | | | |
|---|---|---|---|---|
| 5,021,682 A | * | 6/1991 | Hobrecht | 327/542 |
| 5,119,016 A | * | 6/1992 | Seger | 323/314 |
| 5,311,146 A | * | 5/1994 | Brannon et al. | 330/288 |
| 5,343,034 A | * | 8/1994 | Sato | 250/214 C |
| 5,638,025 A | * | 6/1997 | Johnson | 330/255 |
| 5,640,110 A | * | 6/1997 | Niratsuka et al. | 327/108 |
| 5,905,368 A | * | 5/1999 | Kolluri et al. | 323/224 |
| 5,961,215 A | * | 10/1999 | Lee et al. | 374/178 |
| 6,380,771 B1 | | 4/2002 | Nakagawa | |
| 6,489,847 B1 | * | 12/2002 | van Zeijl | 330/255 |
| 6,545,513 B2 | * | 4/2003 | Tsuchida et al. | 327/108 |
| 6,597,210 B2 | * | 7/2003 | Carsten | 327/108 |
| 2003/0042982 A1 | | 3/2003 | Yasukouchi et al. | 330/267 |
| 2003/0132796 A1 | * | 7/2003 | Gailhard et al. | 327/543 |

FOREIGN PATENT DOCUMENTS

| | | |
|---|---|---|
| JP | A-59-086317 | 5/1984 |
| JP | A-07-222482 | 8/1995 |
| JP | A-2003-258569 | 9/2003 |

OTHER PUBLICATIONS

Office Action dated Jun. 10, 2008 in corresponding Japanese Patent Application No. 2004-005393(and English translation).

* cited by examiner

Primary Examiner—Lincoln Donovan
Assistant Examiner—Khareem E Almo
(74) Attorney, Agent, or Firm—Posz Law Group, PLC

(57) ABSTRACT

An output circuit comprises first and second transistors, a driving circuit and a current mirror circuit. The driving circuit supplies a relatively small constant current to the base of the first transistor. When a current flows to the collector of the first transistor, a current with a magnitude set at a fixed ratio with respect to the current flows to the collector of the second transistor, and a current proportional to the current flowing to the collector of the second transistor flows to the base of the first transistor by way of the current mirror circuit. That is, a current, which is determined in accordance with a current flowing to the collector of the first transistor, flows to the base of the first transistor.

4 Claims, 3 Drawing Sheets

OUTPUT CIRCUIT AND OPERATIONAL AMPLIFIER

CROSS REFERENCE TO RELATED APPLICATION

This application is based on and incorporates herein by reference Japanese Patent Application No. 2004-5393 filed on Jan. 13, 2004.

FIELD OF THE INVENTION

The present invention relates to an output circuit using an output transistor as a current source, and relates to an operational amplifier using such an output circuit.

BACKGROUND OF THE INVENTION

In recent years, reduction of the voltage of a power supply for a semiconductor integrated circuit device and reduction of the power consumption of the semiconductor integrated circuit device became more and more necessary. U.S. 2003/0042982A1 (JP 2003-69346A) discloses an operational amplifier capable of reducing an idling current of a source-side output transistor by controlling a current flowing through the collector of the source-side output transistor based on an electric potential appearing at the base of a ground-side output transistor.

In addition, JP 2003-258569A discloses a B-class push-pull output circuit in which an input voltage appearing at a signal input terminal is supplied to the bases of third and fourth transistors and, after being shifted by a voltage between the base and emitter of each of the third and fourth transistors, are supplied to first and second transistors composing a complementary push-pull configuration.

In this push-pull output circuit, a current flowing through the collector of the third transistor changes only slightly even if the input voltage and/or the load of push-pull output circuit vary. By using this push-pull output circuit, increases of crossover distortions and current consumptions, which are increases caused by unbalances among base-emitter voltages of the first to fourth transistors, can be suppressed. Here, the base-emitter voltage of a transistor means a voltage appearing between the base and emitter of the transistor.

FIGS. 4A and 4B are circuit diagrams showing a push-pull output circuit employed in the prior art operational amplifier 1. Between a power supply line 2 for supplying a voltage to the operational amplifier 1 and a power supply line 3 serving as a ground line, an NPN-type transistor Q1 and a PNP-type transistor Q2 are provided on both sides of an output terminal 4, being connected to each other through the terminal 4.

Between the bases of the transistors Q1 and Q2, diodes D1 and D2 are connected in series with the polarities of the diodes D1 and D2 oriented in a direction shown in the figure.

On the source side including the transistor Q1, a transistor Q3 is connected between the power supply line 2 and a constant current circuit 5. A transistor Q4 is connected between the power supply line 2 and the base of the transistor Q1. The transistors Q3 and Q4 compose a current mirror circuit 6. The current mirror circuit 6 is a driving circuit for flowing a current to the base of the transistor Q1.

On the ground side (sink side) including the transistor Q2, on the other hand, a transistor Q5 for flowing a current to the base of the transistor Q2 is connected between the base of the transistor Q2 and the power supply line 3. A resistor 7 is connected between the base and emitter of the transistor Q5. It is to be noted that a load 8 is connected to the output terminal 4.

The operational amplifier 1 is designed based on a current supplied by the current mirror circuit 6 to the base of the transistor Q1 or a current generated by the constant current circuit 5 for an assumed case in which a current flowing through the load 8 reaches a maximum value. In the operational amplifier 1 designed in this way, a wasteful current flows to the base of the transistor Q1 when the current flowing through the load 8 decreases.

If the operational amplifier 1 is designed by assuming that the maximum output current is −40 mA and the minimum value of the direct-current gain hFE of the transistor Q1 is 20, for example, the current value of the constant current circuit 5 needs to be set at least 2 mA. Thus, a current of at least 2 mA always continues to flow to the base of the transistor Q1 even if no load is connected.

SUMMARY OF THE INVENTION

It is thus an object of the present invention addressing the problem described above to provide an output circuit capable of reducing a current required for driving circuit an output transistor and provide an operational amplifier employing the output circuit.

In one aspect of the present invention, a current detection circuit detects a current flowing through an output transistor functioning as a current source and a driving circuit supplies a current to the base of the output transistor based on a current detected by the current detection circuit. Thus, by providing the driving circuit with a base current supplying capability as a largest possible capability of driving the output transistor even if a current output by an output circuit reaches a maximum value, a proper current required for driving the output transistor can be supplied to the base of the output transistor for a load range of no load to a maximum load, and the magnitude of a current wastefully consumed due to an excessive current flowing to the base of the output transistor can be reduced.

A current having a magnitude set at a fixed ratio with respect to the current flowing to the output transistor flows to a detection transistor. The current flowing to the detection transistor is a current flowing to the base of the output transistor by way of a current mirror circuit. Thus, by adjusting parameters such as the ratio of the area of an emitter employed in the output transistor to the area of an emitter employed in the detection transistor and the ratio of the areas of emitters employed in transistors composing the current mirror circuit, the ratio of a collector current of the output transistor to a base current of the output transistor can be set at a value corresponding to the direct-current gain of the output transistor.

In the other aspect of the present invention, a voltage detection circuit detects a voltage appearing at an output terminal and a driving circuit supplies a current, which is determined in accordance with the detected voltage, to the base of the output transistor. This scheme is suitable for an application and/or a load in which a current corresponding to a voltage appearing at the output terminal flows. Conversely, this scheme is not suitable for an application and/or a load in which the output voltage is controlled to a fixed value without regard to the output current.

By providing the driving circuit with a base current supplying capability as a largest possible capability of driving the output transistor even if a current output by an output circuit reaches a maximum value, a proper current required for driving the output transistor can be supplied to the base of the output transistor for a load range of no load to a maximum load, and the magnitude of a current wastefully consumed due to an excessive current flowing to the base of the output transistor can be reduced.

A first current mirror circuit inputs a current, which is determined in accordance with a voltage appearing at the output terminal, and outputs a current corresponding to a mirror ratio. On the other hand, a second current mirror circuit inputs the current output by the first current mirror circuit and outputs a current corresponding to a mirror ratio to the base of the output transistor. Thus, by adjusting parameters such as the ratio of the areas of emitters employed in transistors composing the first and second current mirror circuits and the ratio of the areas of emitters employed in transistors composing the second current mirror circuit, the ratio of a current flowing through the collector of the output transistor as a current having a fixed relation with the output voltage to a current flowing through the base of the output transistor can be properly set.

The present invention further includes a driving circuit for supplying a predetermined current to the base of the output transistor. When the load increases from a no-load state to a maximum value all of a sudden, for example, a current immediately flows to the collector of the output transistor and the magnitude of the current immediately flowing to the collector of the output transistor is determined in accordance with the current flowing from the driving circuit to the base of the output transistor. Furthermore, by virtue of an amplification effect of a closed loop comprising a current detection circuit or the voltage detection circuit, the driving circuit, and the output transistor, the current flowing to the base of the output transistor and, hence, the current flowing to the collector of the output transistor, can be raised precipitously.

Since the above output circuit is employed on the current source side of the push-pull output circuit included in an operational amplifier, the current consumption of the operational amplifier can be decreased.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
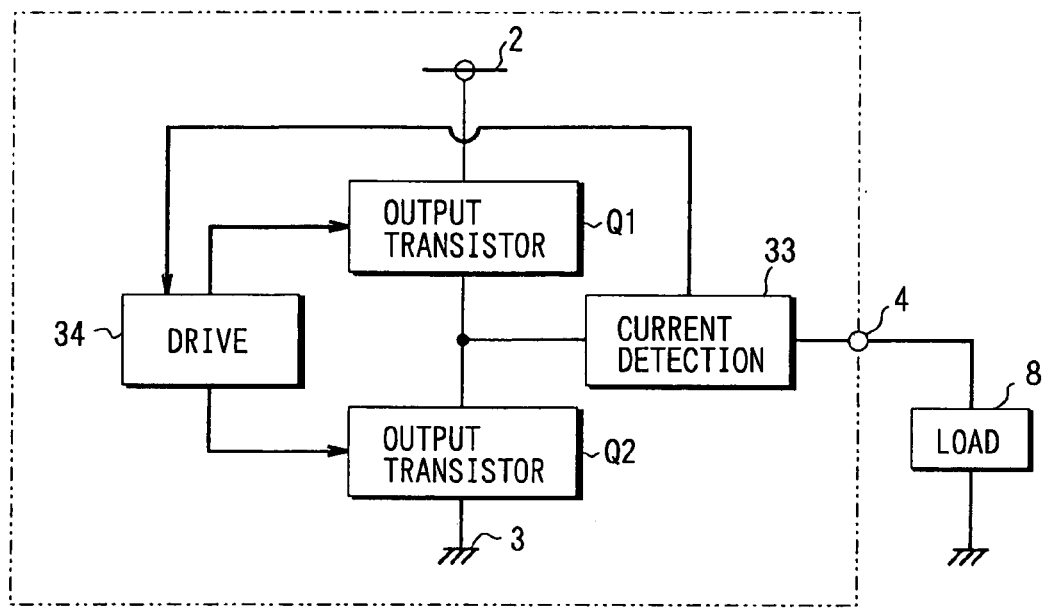
FIG. 1A is a block diagram showing a push-pull output circuit of an operational amplifier in a first embodiment of the present invention.
Figure 1B:
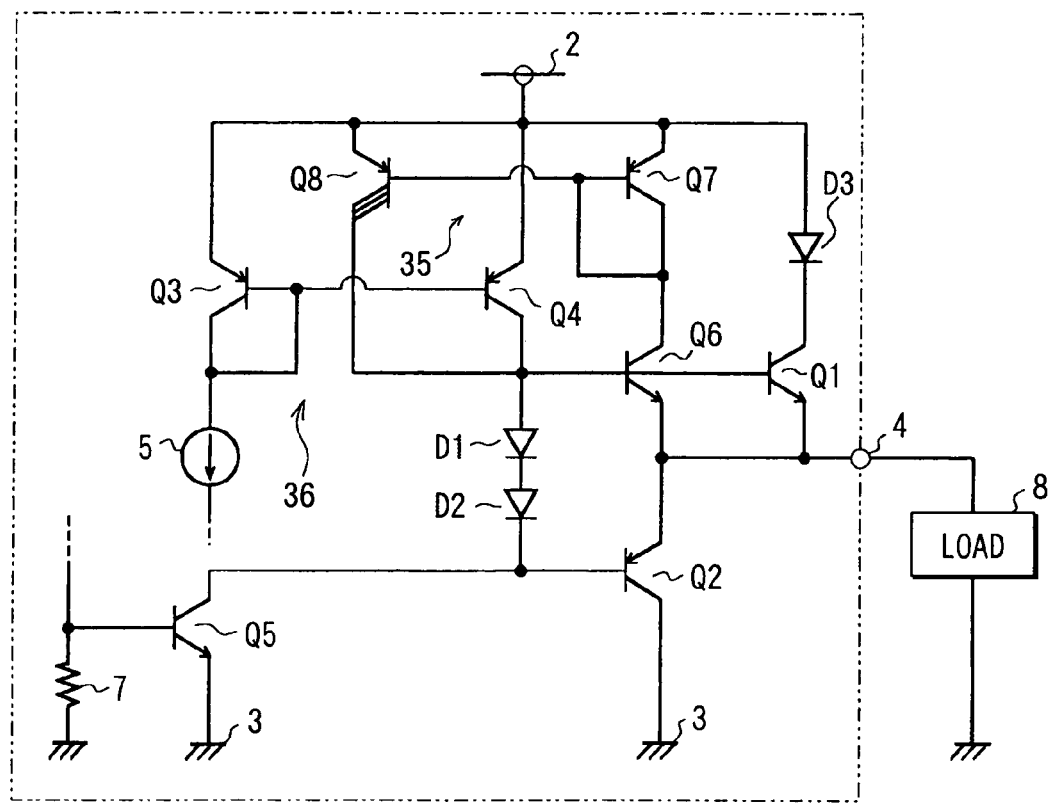
FIG. 1B is an electric wiring diagram showing a detailed circuit of the push-pull output circuit.
Figure 2:
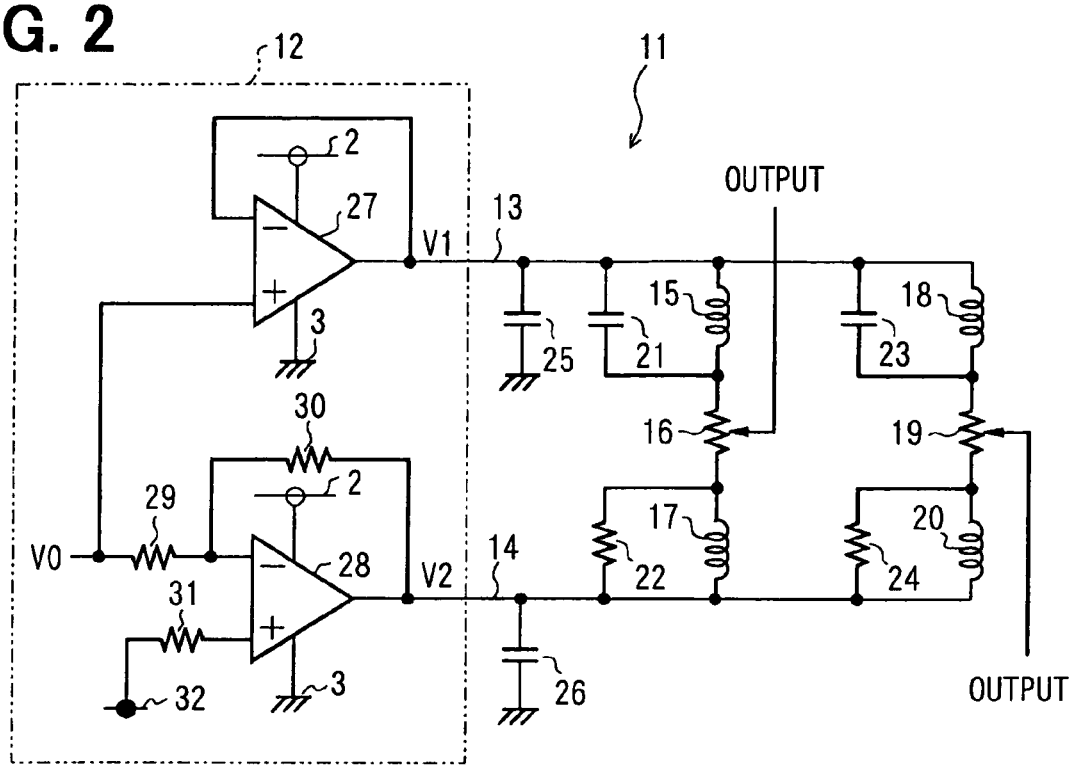
FIG. 2 is an electric wiring diagram showing an electrical configuration of a torque sensor.
Figure 4A:
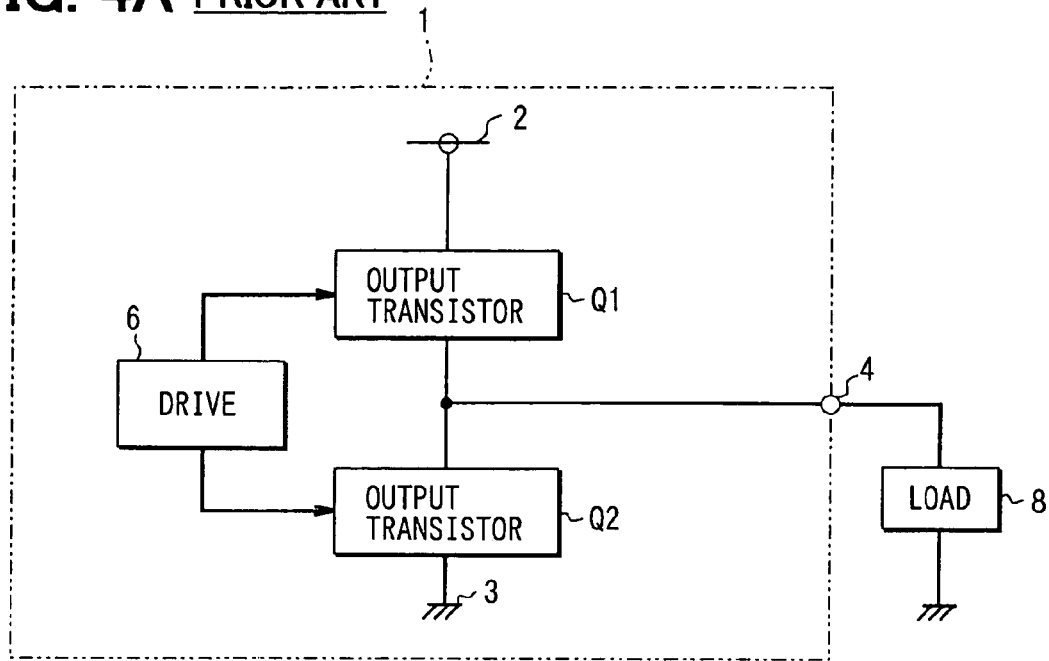
FIG. 4A is a block diagram showing a push-pull output circuit of a prior art operational amplifier.
Figure 4B:
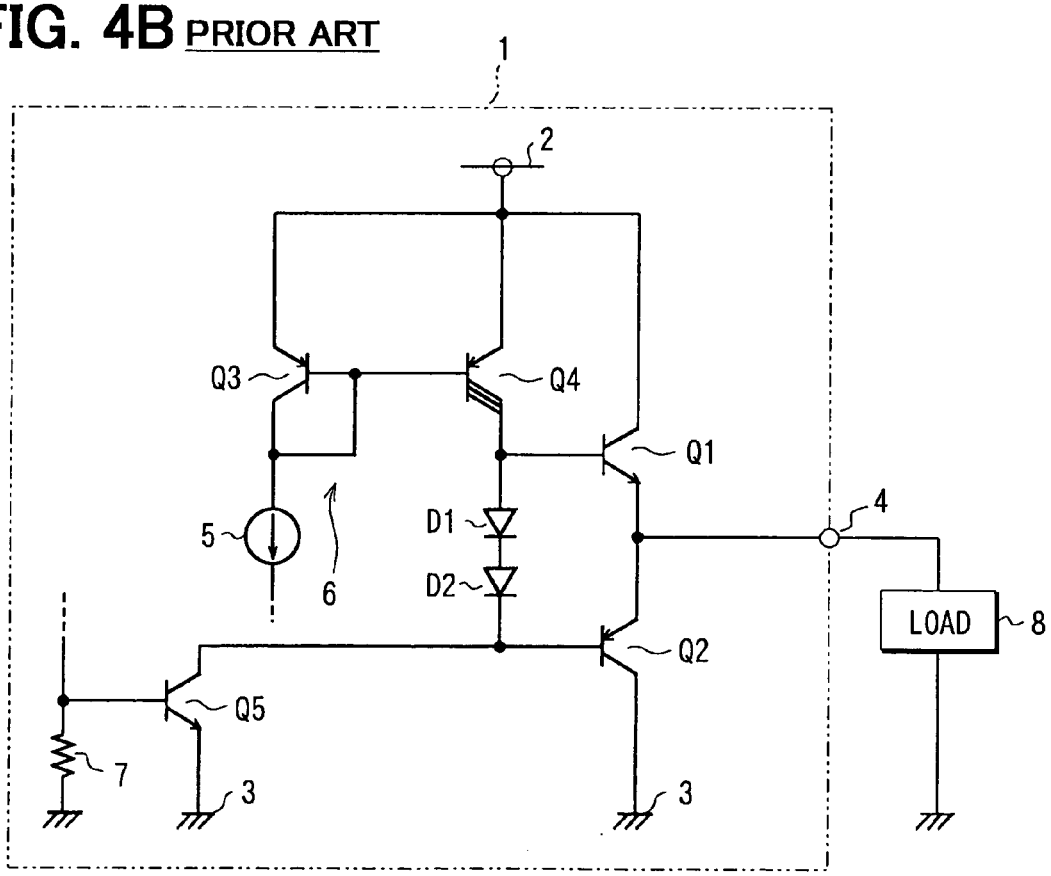
FIG. 4B is an electric wiring diagram showing a detailed circuit of the push-pull output circuit.

In FIGS. 1A, 1B and 2 showing a first embodiment, components identical with counterparts shown in FIGS. 4A and 4B are denoted by the same reference numerals and the same reference notations as the counterparts.

Referring to FIGS. 1A and 1B showing a push-pull output circuit employed in an operational amplifier, between a power supply line 2 and an output terminal 4, a diode D3 with its polarity oriented in a direction shown in the figure and an NPN-type transistor Q1 serving as a current source are connected in series. Between the output terminal 4 and a power supply line 3 serving as a ground line, a PNP-type transistor Q2 serving as a current ground is connected. The base of a transistor Q6 employed in a current detection circuit 33 as a current detection transistor is connected to the base of the transistor Q1.

Similarly, the emitter of the transistor Q6 is connected to the emitter of the transistor Q1. A current, which is determined in accordance with a current flowing to the collector of the transistor Q1, flows to the collector of the transistor Q6. The current flowing to the collector of the transistor Q1 is a current output by the operational amplifier.

A driving circuit 34 is a circuit for supplying a current corresponding to a current detected by the current detection circuit 33 to the base of the transistor Q1 and supplying a current to the base of the transistor Q2. The transistor Q1 is driven mainly by a current mirror circuit 35 comprising transistors Q7 and Q8 and complementarily by a driving circuit 36 comprising transistors Q3 and Q4 and a constant current circuit 5. Unlike the conventional circuit, a current output by the constant current circuit 5 is set at a smallest possible value required for activation of the transistor Q1. The transistor Q2 is driven by the transistor Q5.

The emitters of the transistors Q7 and Q8 composing the current mirror circuit 35 are connected to the power supply line 2. The base and collector of the transistor Q7 are connected to the collector of the transistor Q6. The collector of the transistor Q8 is connected to the bases of the transistors Q1 and Q6.

The transistors Q3 and Q4 employed in the driving circuit 36 also compose a current mirror circuit. The emitters of the transistors Q3 and Q4 are connected to the power supply line 2. The base and collector of the transistor Q3 are connected to the constant current circuit 5. In addition, the collector of the transistor Q4 is connected to the bases of the transistors Q1 and Q6.

On the other hand, the collector of the transistor Q5 is connected to the base of the transistor Q2. A resistor 7 is connected between the base and emitter of the transistor Q5. A voltage output by a differential amplifier circuit not shown in the figure is supplied to the base of the transistor Q5. It is to be noted that diodes D1 and D2 with their polarities oriented in a direction shown in the figure are connected in series between the bases of the transistors Q1 and Q2.

The above operational amplifier is used in a torque sensor 11 of a power steering apparatus employed in a vehicle constructed as shown in FIG. 2. A portion enclosed by a double-dotted line can be regarded as an IC 12 using operational amplifiers 27 and 28, each of which is constructed as shown in FIGS. 1A and 1B. The torque sensor 11 is a sensor for detecting a torque based on variations in coil inductance, which are caused by an elastic deformation of a torsion bar not shown in the figure.

Between the voltage supply lines 13 and 14, a series circuit consisting of a coil 15, a resistor 16 and a coil 17 as well as a series circuit consisting of a coil 18, a resistor 19 and a coil 20 are connected. These series circuits are a load 8 borne by operational amplifiers 27 and 28 to be described later. Each of the coils 15, 17, 18 and 20 has a resistance. A capacitor 21, a resistor 22, a capacitor 23 and a resistor 24 are connected in parallel to the coils 15, 17, 18 and 20, respectively.

A capacitor 25 is connected between the voltage supply line 13 and the ground whereas a capacitor 26 is connected between the voltage supply line 14 and the ground. The resistors 16 and 19 are each a variable resistor and signal voltages appearing at the movable terminals of the resistors 16 and 19 are a voltage corresponding to a torque.

A reference alternating current voltage V0 is supplied to the IC 12, which comprises operational the amplifiers 27 and 28 used respectively for supplying alternating current voltages V1 and V2, which have phases opposite to each other, to the voltage supply lines 13 and 14 respectively. Each of the operational amplifiers 27 and 28 receives a power from the power supply lines 2 and 3. The operational amplifier 27 is a circuit having a voltage-follower connection.

On the other hand, the operational amplifier 28 has a connection of an inverting amplifier circuit employing resistors 29 to 31. An offset reference voltage of typically 3.5V is supplied to the non-inverting input terminal from the power supply line 32. It is to be noted that the reference alternating current voltage V0 is typically a sinusoidal voltage having an amplitude of 1.5V centering at a level of 3.5V.

In the first embodiment, the torque sensor 11 is in operation, the operational amplifiers 27 and 28 keep outputting the alternating current voltages V1 and V2 respectively to the voltage supply lines 13 and 14, respectively. In addition to the operations to output the alternating current voltages V1 and V2, each of the operational amplifiers 27 and 28 outputs an AC current, which has instantaneous values determined in accordance with the instantaneous values of the alternating current voltage, from the source to the ground. The driving circuit 36 supplies a relatively small constant current to the base of the transistor Q1. In a condition with no load or a very small load 8, the current supplied to the base of the transistor Q1 becomes a predominant current driving the transistor Q1.

When a collector current flows to the collector of the transistor Q1, a current having a magnitude set at a fixed ratio with respect to this collector current flows to the collector of the transistor Q6. This current flowing to the collector of the transistor Q6 is a current flowing to the base of the transistor Q1 by way of the current mirror circuit 35. The current flowing to the collector of the transistor Q1 is a source output current of the operational amplifier 27 or 28.

When a current flows to the collector of the transistor Q1, a current flowing to the base of the transistor Q1 increases. As a result, a current corresponding to a current flowing to the collector of the transistor Q1 or corresponding to a current output by the operational amplifier 27 or 28 flows to the base of the transistor Q1 itself.

Thus, by providing the current mirror circuit 35 with a base current supplying capability as a largest possible capability of driving the transistor Q1 even if a load 8 connected between the voltage supply lines 13 and 14 reaches a peak so that the current output by the operational amplifier 27 or 28 reaches a maximum value, a minimum current required for driving the transistor Q1 can be supplied to the base of the transistor Q1 for a load range of no load to a maximum load.

As a result, the magnitude of a current wastefully consumed due to an excessive current flowing to the base of the transistor Q1 as is the case with the output transistor employed in the conventional circuit shown in FIGS. 4A and 4B can be reduced. The load 8 is the series circuit comprising a coil and a resistor as described above.

In addition, since the driving circuit 36 is provided, when the load 8 increases from a no-load state to a maximum value all of a sudden, for example, a current flows immediately to the collector of the transistor Q1 and the magnitude of the current immediately flowing to the collector of the transistor Q1 is determined in accordance with the current flowing from the driving circuit 36 to the base of the transistor Q1. Furthermore, by virtue of an amplification effect of a closed loop comprising the current detection circuit 33, the driving circuit 34, and the transistor Q1, the current flowing to the base of the transistor Q1 and, hence, the current flowing to the collector of the transistor Q1, can be raised precipitously.

In addition, since the diode D3 is provided between the power supply line 2 and the collector of the transistor Q1, a voltage appearing between the collector and emitter of the transistor Q1 becomes equal to a voltage appearing between the collector and emitter of the transistor Q6 so that an early effect between the two transistors is eliminated. As a result, the current detection can be implemented with a higher degree of precision.

Second Embodiment

Figure 3:
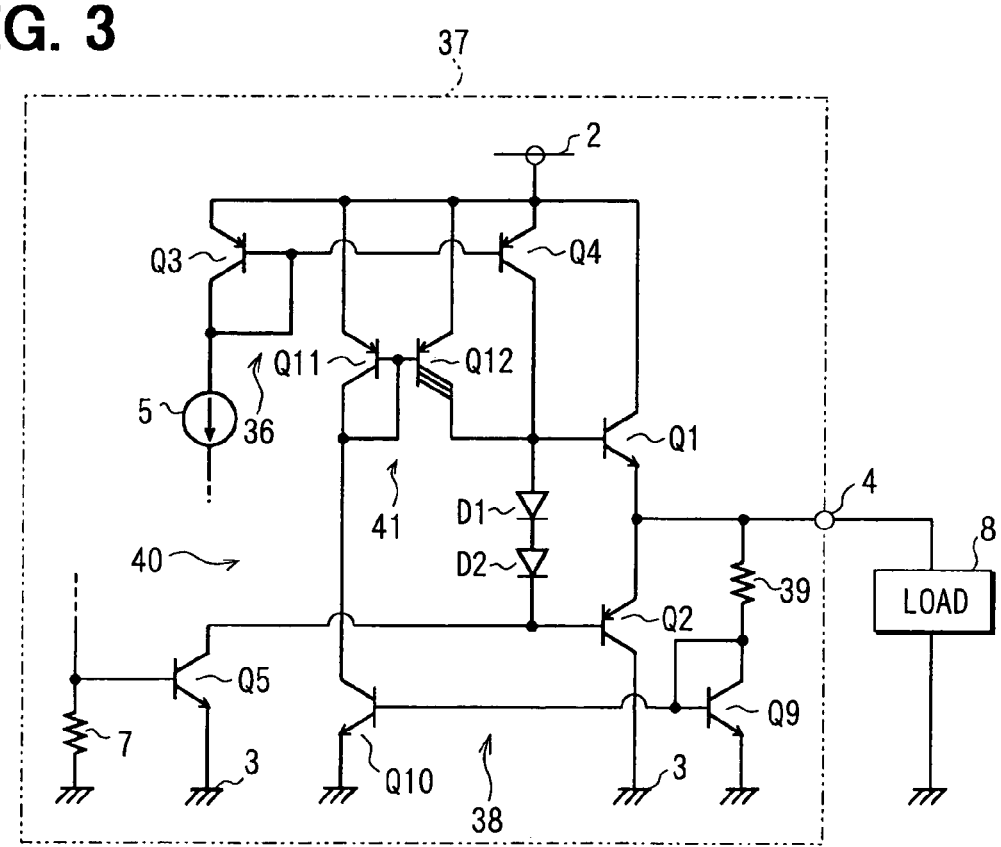
FIG. 3 is an electric wiring diagram of a second embodiment of the present invention.

A second embodiment shown in FIG. 3 is different from the first one in that, an operational amplifier 37 employs a voltage detection circuit 38 in place of the current detection circuit 33 of the first embodiment. In FIG. 3, components identical with their counterparts shown in FIG. 1B are denoted by the same reference numerals and the same reference notations as the counterparts. Much like the first embodiment, the operational amplifier 37 is typically used in an IC for a torque sensor.

The voltage detection circuit 38 comprises a resistor 39 as well as transistors Q9 and Q10. That is, between the output terminal 4 and the power supply line 3, the resistor 39 and the transistor Q9 are connected in series. The base and collector of the transistor Q9 are connected to each other. The transistors Q9 and Q10 form a current mirror circuit corresponding to a first current mirror circuit. The voltage detection circuit 38 detects a voltage appearing at the output terminal 4 and outputs a current, which is determined in accordance with the detected voltage.

A circuit included in the driving circuit 40 as a circuit for driving the transistor Q1 is a current mirror circuit 41 corresponding to a second current mirror circuit. The current mirror circuit 41 comprises transistors Q11 and Q12. The emitters of the transistors Q11 and Q12 are connected to the power supply line 2. The base and collector of the transistor Q11 are connected to the collector of the transistor Q10. The collector of the transistor Q12 is connected to the base of the transistor Q1. It is to be noted that the collector of the transistor Q1 is directly connected to the power supply line 2.

In this configuration, a current proportional to an output voltage, which is a voltage appearing at the output terminal 4, flows into the transistor Q9. This current is a current flowing to the base of the transistor Q1 by way of the transistors Q10, Q11, and Q12. When the transistor Q1 outputs a current to the load 8, a voltage appearing at the load 8 increases. Thus, due to the closed loop described above, the current flowing to the base of the transistor Q1 also rises. As a result, a current, which is determined in accordance with a voltage output by the operational amplifier 37, flows to the base of the transistor Q1.

Thus, also in the case of this embodiment, a base current supplying capability can be provided as a largest possible capability of driving the transistor Q1 so that a minimum current required for driving the transistor Q1 can be supplied to the base of the transistor Q1 for a load range of no load to a maximum load. As a result, the magnitude of a current wastefully consumed due to an excessive current flowing to the base of the transistor Q1 as is the case with the output transistor employed in the conventional circuit can be reduced.

In addition, since the collector of the transistor Q1 is connected to the power supply line 2, the operational amplifier 37 is capable of further raising the output-voltage range on the high-potential side in comparison with the operational amplifiers 27 and 28. However, this embodiment is suitable for applications or loads in which a current determined in accordance with a voltage appearing at the output terminal 4 flows. Conversely, this embodiment is not suitable for applications or loads in which control is executed to keep the output voltage at a fixed level without regard to the output current.

OTHER EMBODIMENTS

It is to be noted that the scope of the present invention is not limited to the embodiments shown in the figures. For example, the embodiments can be modified as follows.

The present invention may be implemented in not only a push-pull output circuit, but also a stand-alone source-side output circuit. In addition, the output circuit of the present invention can be used as not only the output circuit of an operational amplifier, but also an output circuit of a comparator or an output circuit of another device in a broad range of applications.

The driving circuit 36 is provided when required. In addition, the present invention can be applied to applications other than the torque sensor.

What is claimed is:

1. An output circuit comprising:
   an output transistor connected to a load and used as a current source connected between a power supply line and an output terminal for the load;
   a current detection circuit for detecting a current flowing through the output transistor, wherein the current detection circuit includes a detection transistor connected in parallel to the output transistor to supply a detection current proportional to a current flowing through the output transistor; and
   a driving circuit for supplying a base current, which is determined in accordance with the detection current supplied by the current detection circuit, to the output transistor,
   wherein the current detection circuit and the driving circuit are connected to form a feedback loop to increase the base current of the output transistor as the current detected increases, wherein:
   the detection transistor has an emitter connected to an emitter of the output transistor and a base connected to a base of the output transistor; and
   the driving circuit includes a current mirror circuit connected to the detection transistor and the output transistor for receiving the detection current, which flows to the detection transistor, as an input, and supplying the base current to the base of the output transistor at a same level as the detection current; and
   a diode having a cathode connected to the output transistor and an anode connected to the current mirror circuit of the driving circuit, wherein the cathode is not directly connected to a collector of the detection transistor.

2. An output circuit for a load comprising:
   an output transistor used as a current source connected between a power supply line and an output terminal, wherein the output terminal is connected to the load in series;
   a current detection circuit for detecting a current flowing through the output transistor, wherein the current detection circuit includes a detection transistor connected to the output transistor between the power supply line and the output terminal to thereby permit a detection current having a fixed ratio to the current flowing to the output transistor to flow to the detection transistor, wherein the detection transistor has an emitter connected to an emitter of the output transistor and a base connected to a base of the output transistor; and
   a driving circuit for supplying a base current, which is proportional to the detection current of the detection transistor, to the output transistor, wherein the driving circuit includes a first transistor and a second transistor connected to form a current mirror circuit, the first transistor being connected in series with a collector of the detection transistor and the second transistor being connected to the base of the detection transistor and the base of the output transistor; and
   a diode having a cathode connected to the collector of the output transistor, wherein the cathode is not directly connected to the collector of the detection transistor.

3. An output circuit comprising:
   an output transistor used as a current source connected between a power supply line and an output terminal connected to a load;
   a current detection circuit for detecting a current flowing through the output transistor, wherein the current detection circuit includes a detection transistor connected in a parallel relation to the output transistor to thereby permit a detection current having a fixed ratio to the current flowing to the output transistor to flow to the detection transistor; and
   a driving circuit for supplying a base current, which is determined in accordance with the detection current of the detection transistor, to the output transistor, wherein the driving circuit includes a current mirror circuit having a first transistor connected in series to the detection transistor and a second transistor connected in parallel relation to the first transistor, wherein a base of the first transistor is connected to a base of the second transistor, wherein a collector of the second transistor is connected to a base of the detection transistor and a base of the output transistor; and
   a diode having a cathode connected to a collector of the output transistor and an anode connected to the current mirror circuit of the driving circuit, wherein the cathode is not directly connected to a collector of the detection transistor.

4. The output circuit according to claim 2, wherein the detection current is smaller than the current flowing to the output transistor.

* * * * *